(12) United States Patent  
Koga

(10) Patent No.: US 8,730,317 B2
(45) Date of Patent: May 20, 2014

(54) SUBSTRATE PROCESSING APPARATUS, SUBSTRATE PROCESSING METHOD AND NON-TRANSITORY COMPUTER STORAGE MEDIUM

(75) Inventor: Norihisa Koga, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 434 days.

(21) Appl. No.: 13/174,322

(22) Filed: Jun. 30, 2011

(65) Prior Publication Data

US 2012/0013730 A1  Jan. 19, 2012

(30) Foreign Application Priority Data

Jul. 16, 2010 (JP) ................................. 2010-161713

(51) Int. Cl.
  *H04N 7/18* (2006.01)
(52) U.S. Cl.
  USPC ............................................................ 348/87
(58) Field of Classification Search
  CPC ....................................................... H04N 7/18
  USPC ............................................................. 348/87
  See application file for complete search history.

(56) References Cited

U.S. PATENT DOCUMENTS 7,652,276 B2 * 1/2010 Hayakawa et al. ........ 250/559.4

FOREIGN PATENT DOCUMENTS

| JP | H05-127088 A | 5/1993 |
| JP | A-2007-240519 | 9/2007 |
| JP | 2009-194335 A | 8/2009 |

* cited by examiner

*Primary Examiner* — Y Lee
*Assistant Examiner* — Francis G Geroleo
(74) *Attorney, Agent, or Firm* — Posz Law Group, PLC

(57) ABSTRACT

A substrate processing apparatus includes: a holding unit holding a substrate; a rotation driving unit rotating the substrate held on the holding unit; a moving mechanism moving the holding unit between a delivery position and an edge exposure position; an exposure unit provided on the edge exposure position side and exposing an edge portion of a coating film above the substrate held on the holding unit; an image capturing unit provided on the edge exposure position side and above the exposure unit and capturing an image of the substrate held on the holding unit; and a direction change unit changing a direction of an optical path formed between the substrate held on the holding unit and the image capturing unit. The direction change unit includes a first reflecting mirror, a second reflecting mirror, and a third reflecting mirror.

8 Claims, 9 Drawing Sheets

SUBSTRATE PROCESSING APPARATUS, SUBSTRATE PROCESSING METHOD AND NON-TRANSITORY COMPUTER STORAGE MEDIUM

BACKGROUND OF THE INVENTION

1. Field of the Invention

The present invention relates to a substrate processing apparatus, a substrate processing method and a non-transitory computer storage medium.

2. Description of the Related Art

In a photolithography processing in manufacture of a semiconductor device, for example, resist coating treatment of applying a resist solution onto a semiconductor wafer (hereinafter, referred to as a "wafer") to form a resist film, edge exposure processing of selectively exposing an edge portion of the resist film, exposure processing of exposing the resist film whose edge portion has been exposed to a predetermined pattern, developing treatment of developing the exposed resist film and so on are performed in sequence to form a predetermined resist pattern on the wafer.

Further, the wafer which is subjected to the photolithography processing as described above is subjected to so-called macro defect inspection by an inspection apparatus. The macro defect inspection is performed at various timings, for example, after the edge exposure processing is performed. In this case, whether a predetermined resist film is formed on the wafer surface, whether there is defect or adhesion of foreign matter, or the like examined.

In such a macro defect inspection, while, for example, a mounting table mounting a wafer thereon is being moved, illumination is applied from an illumination unit to the wafer on the mounting table through a half mirror and reflection light from the wafer is reflected off the half mirror and an image of the wafer is captured, for example, by an image capturing apparatus of a CCD line sensor in the inspection unit. Then, image processing is performed on the image to judge the presence or absence of defects (Japanese Patent Application Laid-open No. 2007-240519)

Further, the above-described photolithography processing and defect inspection are performed, for example, in a coating and developing treatment apparatus and an exposure apparatus. In the coating and developing treatment apparatus, there provided are, for example, an inspection apparatus performing inspection of the wafer is provided in addition to solution treatment apparatuses such as a resist coating apparatus performing the above-described resist coating treatment, a developing treatment apparatus performing the developing treatment and so on or an edge exposure apparatus performing the edge exposure processing. In short, the inspection apparatus is provided separately from the edge exposure apparatus and the like. Further, in the coating and developing treatment apparatus, a transfer apparatus for transferring the wafer to the processing and treatment apparatuses is also provided (Japanese Patent Application Laid-open No. 2007-240519).

SUMMARY OF THE INVENTION

In order to obtain a precise image with no distortion of image, in particular, no distortion at its end portion, it is better to ensure the work distance of an optical path between the wafer on the mounting table and the image capturing apparatus as long as possible. However, in the inspection apparatus described in Japanese Patent Application Laid-open No. 2007-240519, the arrangement of the image capturing apparatus, the illumination apparatus and the half mirror in plan view is determined because there is restriction on the apparatus space, and therefore it is difficult to make the work distance between the image capturing apparatus and the illumination apparatus (half mirror) longer. Therefore, a distortion may occur in the image of the wafer captured by the image capturing apparatus, so that the inspection of the wafer cannot be appropriately performed in some cases.

Further, when using the coating and developing treatment apparatus in Japanese Patent Application Laid-open No. 2007-240519, the wafer for which the edge exposure processing in the edge exposure apparatus has been completed is transferred by the transfer apparatus to the inspection apparatus. In this case, during the transfer of the wafer from the edge exposure apparatus to the inspection apparatus, it is impossible to use the above-described transfer apparatus for another wafer. In other words, the other wafer sometimes needs to be kept waiting even though the other wafer has undergone processing and is able to be transferred to another processing apparatus, resulting in occurrence of waiting for transfer. Therefore, there is room to improve the throughput of the wafer processing.

The present invention has been made in consideration of the above points, and an object thereof is to obtain, in inspection of a substrate after edge exposure processing, a precise image with no distortion of image and appropriately perform inspection while improving the throughput of substrate processing including the inspection.

To achieve the above object, the present invention is a substrate processing apparatus, including: a holding unit holding a substrate; a rotation driving unit rotating the substrate held on the holding unit; a moving mechanism moving the holding unit between a delivery position where the substrate is delivered from/to an outside and an edge exposure position where edge exposure processing is performed on an edge portion of a coating film formed above the substrate; an exposure unit provided on the edge exposure position side and exposing the edge portion of the coating film above the substrate held on the holding unit; an image capturing unit provided on the edge exposure position side and above the exposure unit and capturing an image of the substrate held on the holding unit; and a direction change unit provided between the delivery position and the edge exposure position and changing a direction of an optical path formed between the substrate held on the holding unit and the image capturing unit, wherein the direction change unit includes: a first reflecting mirror reflecting light reflected upward in a vertical direction from the substrate, in a horizontal direction to the edge exposure position side; a second reflecting mirror reflecting light from the first reflecting mirror, obliquely upward at a predetermined reflection angle to the delivery position side; and a third reflecting mirror reflecting light from the second reflecting mirror, in a horizontal direction to the edge exposure position side to transmit the light to the image capturing unit.

Since the direction change unit of the present invention has the first reflecting mirror, the second reflecting mirror, and the third reflecting mirror, the work distance of the optical path between the substrate held on the holding unit and the image capturing unit can be made longer without changing the position of the image capturing unit in plan view. Accordingly, it is possible to obtain a precise image with less distortion of image in the image capturing unit and appropriately conduct the inspection of the substrate.

In addition, since the exposure unit, the image capturing unit, the rotation driving unit and the moving mechanism are provided in the substrate processing apparatus of the present invention, it is possible to perform both of the edge exposure processing of the substrate and the inspection of the substrate while transferring the substrate in the substrate processing apparatus. Concretely, the substrate held on the holding unit is first moved to the edge exposure position by the moving mechanism, and light is applied from the exposure unit to the edge portion of the coating film above the substrate while the substrate is being rotated by the rotation driving unit to expose the edge portion at the edge exposure position. Then, an image of the substrate is captured by the image capturing unit during a time when the substrate held on the holding unit is moved by the moving mechanism from the edge exposure position to the delivery position and when the substrate passes under the direction change unit, and the substrate is inspected for a defect based on the captured image of the substrate. Therefore, according to the present invention, when performing the edge exposure processing of the substrate and the inspection of the substrate, it becomes unnecessary to transfer the substrate between the edge exposure apparatus and the inspection apparatus using the transfer apparatus as in the prior art, so that another substrate can be transferred between other processing apparatuses using the transfer apparatus. Therefore, it is possible to reduce other substrates waiting for transfer and improve the throughput of the substrate processing. Furthermore, it is unnecessary to individually provide the edge exposure apparatus and the inspection apparatus as in the prior art, contributing to a reduction in footprint.

The present invention according to another aspect is a substrate processing method using a substrate processing apparatus, the substrate processing apparatus including: a holding unit holding a substrate; a rotation driving unit rotating the substrate held on the holding unit; a moving mechanism moving the holding unit between a delivery position where the substrate is delivered from/to an outside and an edge exposure position where edge exposure processing is performed on an edge portion of a coating film formed above the substrate; an exposure unit provided on the edge exposure position side and exposing the edge portion of the coating film above the substrate held on the holding unit; an image capturing unit provided on the edge exposure position side and above the exposure unit and capturing an image of the substrate held on the holding unit; and a direction change unit including a first reflecting mirror reflecting light reflected upward in a vertical direction from the substrate, in a horizontal direction to the edge exposure position side; a second reflecting mirror reflecting light from the first reflecting mirror, obliquely upward at a predetermined reflection angle to the delivery position side; and a third reflecting mirror reflecting light from the second reflecting mirror, in a horizontal direction to the edge exposure position side to transmit the light to the image capturing unit, and changing a direction of an optical path formed between the substrate held on the holding unit and the image capturing unit, and provided between the delivery position and the edge exposure position, and the substrate processing method including: an edge exposure step of moving the substrate held on the holding unit to the edge exposure position by the moving mechanism and applying light from the exposure unit to the edge portion of the coating film above the substrate while rotating the substrate by the rotation driving unit to expose the edge portion at the edge exposure position; and an inspection step of then capturing an image of the substrate by the image capturing unit during a time when the substrate held on the holding unit is moved by the moving mechanism from the edge exposure position to the delivery position and when the substrate passes under the direction change unit, and inspecting the substrate for a defect based on the captured image of the substrate.

The present invention according to still another aspect is a non-transitory computer-readable storage medium storing a program running on a computer of a control unit controlling a substrate processing apparatus to cause the substrate processing apparatus to execute a substrate processing method, the substrate processing apparatus including: a holding unit holding a substrate; a rotation driving unit rotating the substrate held on the holding unit; a moving mechanism moving the holding unit between a delivery position where the substrate is delivered from/to an outside and an edge exposure position where edge exposure processing is performed on an edge portion of a coating film formed above the substrate; an exposure unit provided on the edge exposure position side and exposing the edge portion of the coating film above the substrate held on the holding unit; an image capturing unit provided on the edge exposure position side and above the exposure unit and capturing an image of the substrate held on the holding unit; and a direction change unit including a first reflecting mirror reflecting light reflected upward in a vertical direction from the substrate, in a horizontal direction to the edge exposure position side; a second reflecting mirror reflecting light from the first reflecting mirror, obliquely upward at a predetermined reflection angle to the delivery position side; and a third reflecting mirror reflecting light from the second reflecting mirror, in a horizontal direction to the edge exposure position side to transmit the light to the image capturing unit, and changing a direction of an optical path formed between the substrate held on the holding unit and the image capturing unit, and provided between the delivery position and the edge exposure position, and the substrate processing method including: an edge exposure step of moving the substrate held on the holding unit to the edge exposure position by the moving mechanism and applying light from the exposure unit to the edge portion of the coating film above the substrate while rotating the substrate by the rotation driving unit to expose the edge portion at the edge exposure position; and an inspection step of then capturing an image of the substrate by the image capturing unit during a time when the substrate held on the holding unit is moved by the moving mechanism from the edge exposure position to the delivery position and when the substrate passes under the direction change unit, and inspecting the substrate for a defect based on the captured image of the substrate.

According to the present invention, it is possible to obtain, in inspection of a substrate after edge exposure processing, a precise image with no distortion of image and appropriately perform inspection while improving the throughput of substrate processing including the inspection.

DETAILED DESCRIPTION OF THE INVENTION

Figure 1:
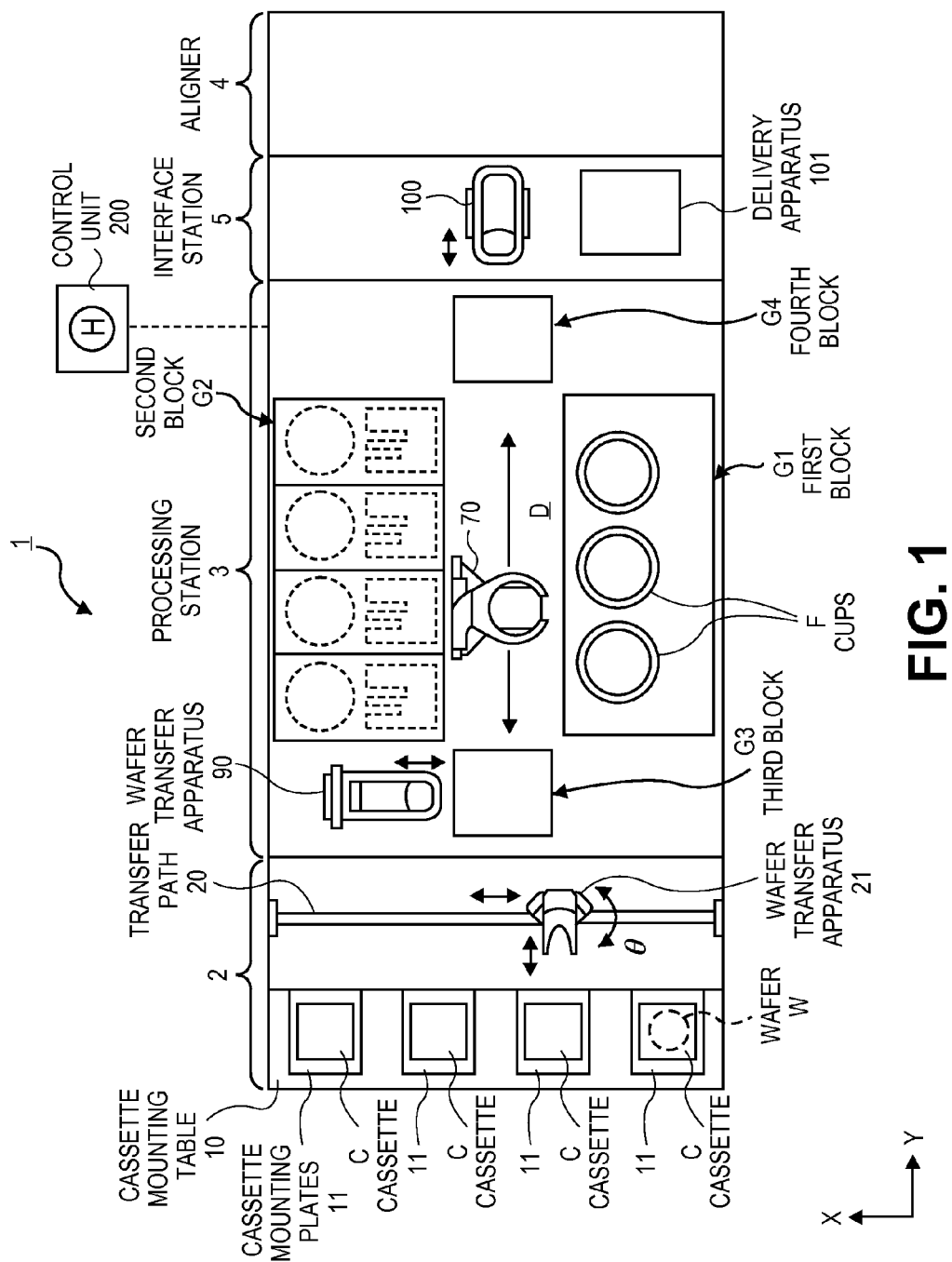
FIG. 1 is a plan view showing the outline of the internal configuration of a coating and developing treatment system including a wafer processing apparatus according to this embodiment.
Figure 2:
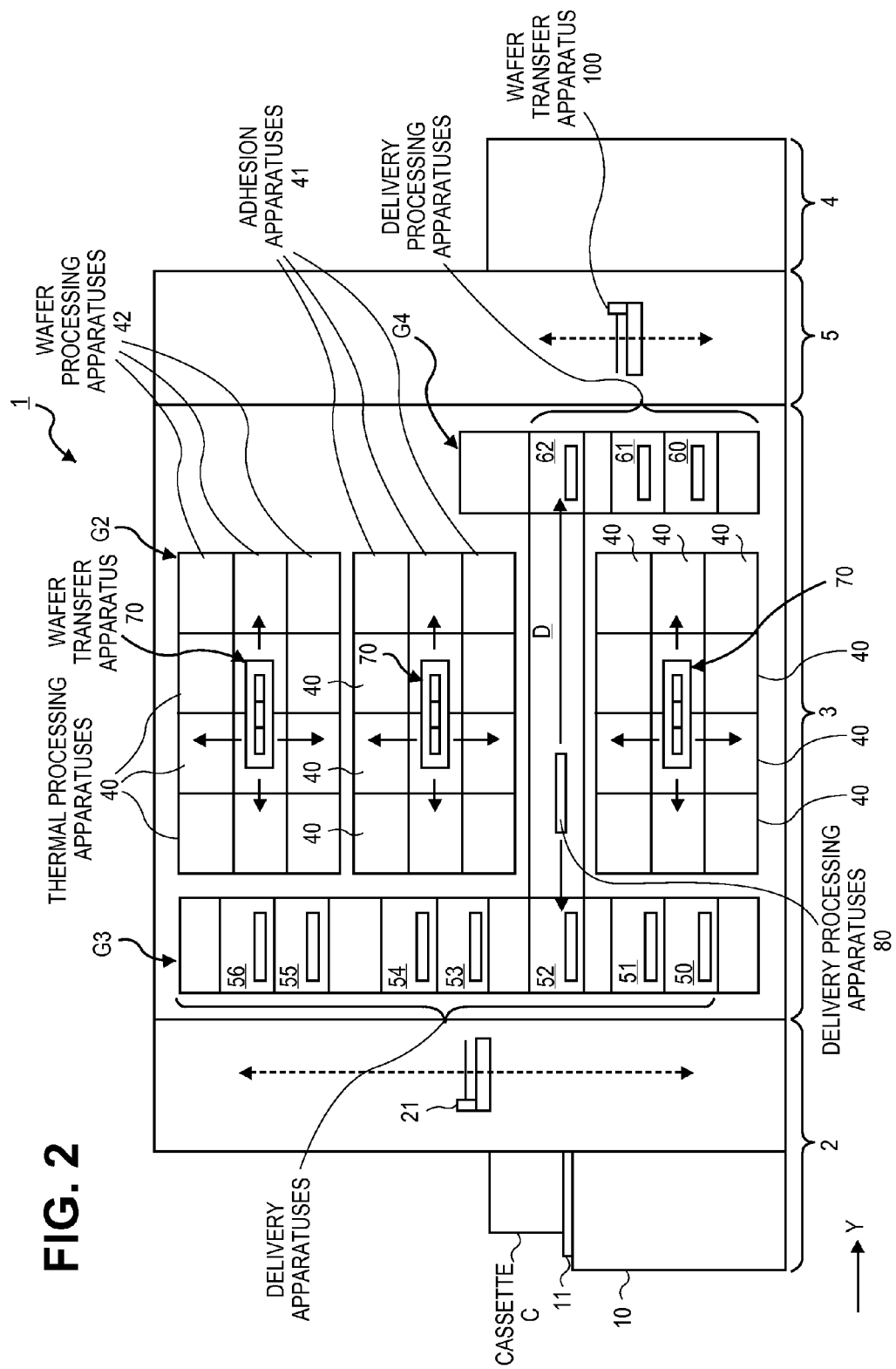
FIG. 2 is a side view showing the outline of the internal configuration of the coating and developing treatment system.
Figure 3:
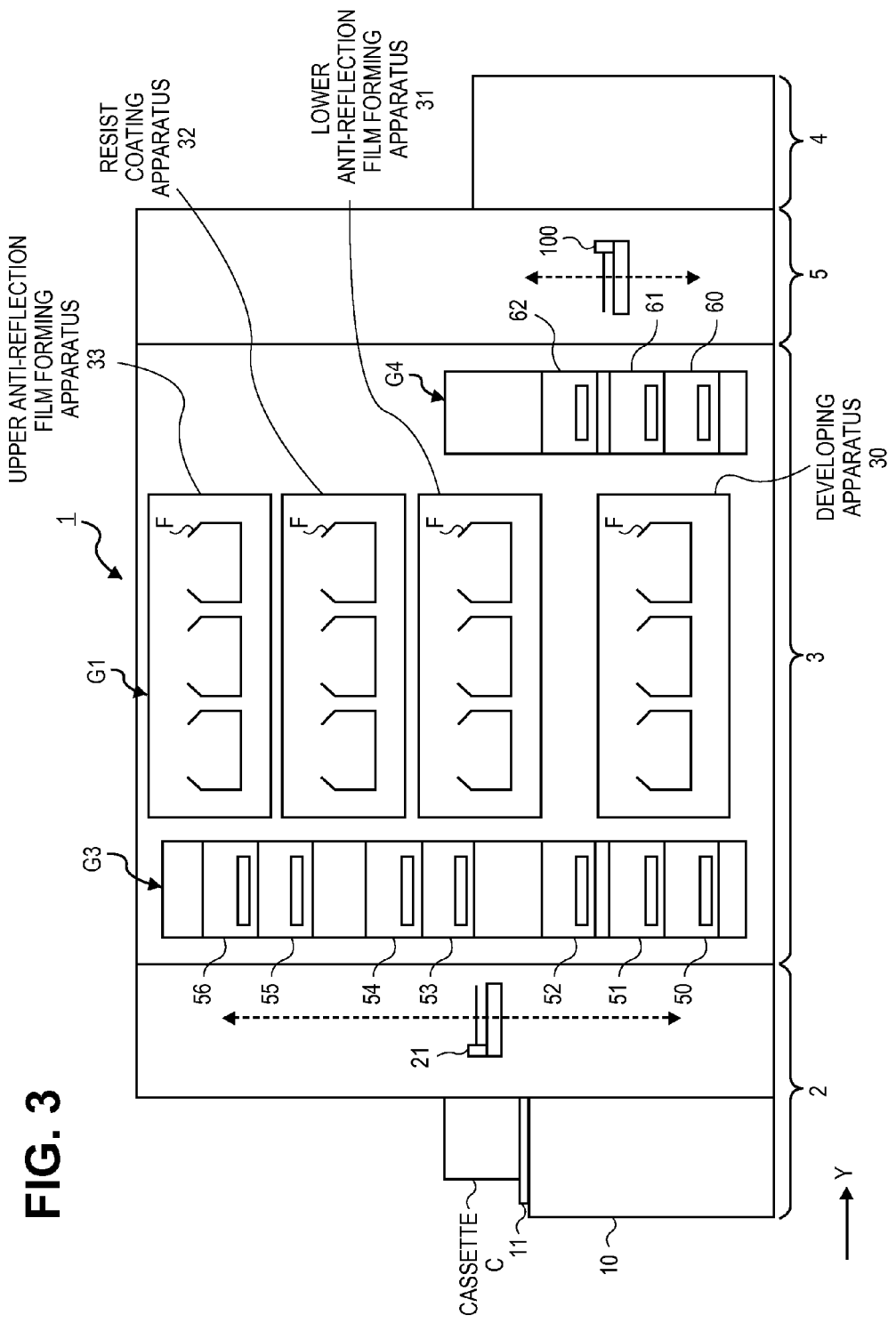
FIG. 3 is a side view showing the outline of the internal configuration of the coating and developing treatment system.

Hereinafter, embodiments of the present invention will be described. FIG. 1 is a plan view showing the outline of the internal configuration of a coating and developing treatment system including a wafer processing apparatus as a substrate processing apparatus according to this embodiment. FIG. 2 and FIG. 3 are side views showing the outline of the internal configuration of the coating and developing treatment system 1.

The coating and developing treatment system 1 has, as shown in FIG. 1, a configuration in which, for example, a cassette station 2 to/from which a cassette C housing a plurality of wafers W therein is transferred from/to the outside, a processing station 3 including a plurality of various kinds of processing and treatment apparatuses for performing predetermined processing or treatment in a manner of single wafer processing in the photolithography processing, and an interface station 5 for delivering the wafers W to/from an aligner 4 adjacent to the processing station 3, are integrally connected together.

In the cassette station 2, a cassette mounting table 10 is provided. On the cassette mounting table 10, a plurality of, for example, four cassette mounting plates 11 are provided. The cassette mounting plates 11 are provided side by side in a line in an X-direction (a top-bottom direction in FIG. 1) being the horizontal direction. On the cassette mounting plates 11, cassettes C can be mounted when the cassettes C are transferred from/to the outside of the coating and developing treatment system 1.

In the cassette station 2, a wafer transfer apparatus 21 is provided which is movable on a transfer path 20 extending in the X-direction as shown in FIG. 1. The wafer transfer apparatus 21 is movable also in the vertical direction and around a vertical axis (in a θ-direction), and can transfer the wafer W between the cassette C on each of cassette mounting plates 11 and a delivery apparatus in a later-described third block G3 in the processing station 3.

In the processing station 3, a plurality of, for example, four blocks G1, G2, G3, G4 are provided each including various apparatuses. On the front side (an X-direction negative direction side in FIG. 1) in the processing station 3, the first block G1 is provided, and on the rear side (an X-direction positive direction side in FIG. 1) in the processing station 3, the second block G2 is provided. Further, on the cassette station 2 side (a Y-direction negative direction side in FIG. 1) in the processing station 3, the third block G3 is provided, and on the interface station 5 side (a Y-direction positive direction side in FIG. 1) in the processing station 3, the fourth block G4 is provided.

For example, in the first block G1, as shown in FIG. 3, a plurality of solution treatment apparatuses, for example, a developing apparatus 30 for performing developing treatment on the wafer W, a lower anti-reflection film forming apparatus 31 for forming an anti-reflection film under a resist film above the wafer W (hereinafter, referred to as a "lower anti-reflection film"), a resist coating apparatus 32 for applying a resist solution to the wafer W to form a resist film as a coating film, and an upper anti-reflection film forming apparatus 33 for forming an anti-reflection film over the resist film above the wafer W (hereinafter, referred to as an "upper anti-reflection film"), are four-tiered in order from the bottom.

Each of the apparatuses 30 to 33 in the first block G1, for example, has a plurality of cups F in the horizontal direction each for housing the wafer W therein during treatment to be able to treat a plurality of wafers W in parallel.

For example, in the second block G2, as shown in FIG. 2, thermal processing apparatuses 40 each for performing thermal processing for the wafer W, adhesion apparatuses 41 each for performing hydrophobic treatment on the wafer W, wafer processing apparatuses 42 each for performing edge exposure processing on an edge portion of the resist film above the wafer W and inspecting for defects of the wafer W for which the edge exposure processing has been finished are arranged one on top of the other and side by side in the vertical direction and in the horizontal direction. The thermal processing apparatus 40 has a heating plate for mounting and heating the wafer W thereon and a cooling plate for mounting and cooling the wafer W thereon so as to be able to perform both heating processing and cooling processing. Note that the numbers and the arrangements of the thermal processing apparatuses 40, the adhesion apparatuses 41, and the wafer processing apparatuses 42 can be arbitrarily selected. Further, the detailed configuration of the wafer processing apparatus 42 will be described later.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as shown in FIG. 1. In the wafer transfer region D, for example, a wafer transfer apparatus 70 is disposed.

The wafer transfer apparatus 70 has a transfer arm movable, for example, in the Y-direction, the X-direction, the θ-direction, and the vertical direction. The wafer transfer apparatus 70 can move in the wafer transfer region D and transfer the wafer W to a predetermined apparatus in the first block G1, the second block G2, the third block G3 and the fourth block G4.

A plurality of wafer transfer apparatuses 70 are vertically arranged, for example, as shown in FIG. 2, and each of them can transfer the wafer W, for example, to a predetermined apparatus at the same height in each of the blocks G1 to G4.

Further, in the wafer transfer region D, a shuttle transfer apparatus 80 linearly transferring the wafer W between the third block G3 and the fourth block G4 is provided.

The shuttle transfer apparatus 80 is configured to be linearly movable, for example, in the Y-direction. The shuttle transfer apparatus 80 can move in the Y-direction while supporting the wafer W and transfer the wafer W between the delivery apparatus 52 in the third block G3 and the delivery apparatus 62 in the fourth block G4.

As shown in FIG. 1, a wafer transfer apparatus 90 is provided adjacently on the X-direction positive direction side of the third block G3 as shown in FIG. 1. The wafer transfer apparatus 90 has a transfer arm that is movable, for example, in the X-direction, the θ-direction, and the vertical direction. The wafer transfer apparatus 90 can move up and down while supporting the wafer W to transfer the wafer W to each of the delivery apparatuses in the third block G3.

In the interface station 5, a wafer transfer apparatus 100 and a delivery apparatus 101 are provided. The wafer transfer apparatus 100 has a transfer arm that is movable, for example, in the Y-direction, the θ-direction, and the vertical direction. The wafer transfer apparatus 100 can transfer the wafer W to each of the delivery apparatuses in the fourth block G4 and the delivery apparatus 101 while supporting the wafer W by the transfer arm.

Figure 4:
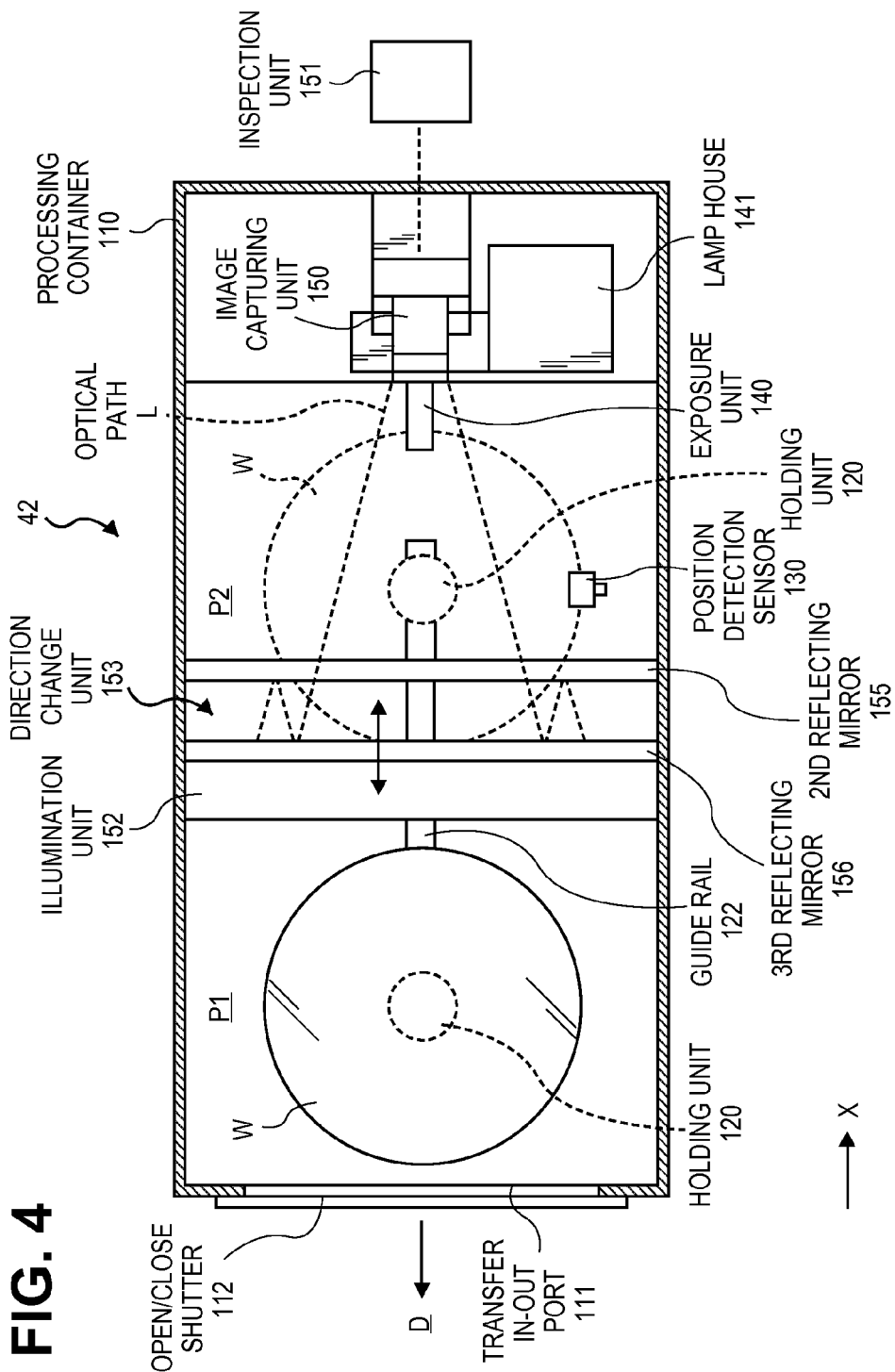
FIG. 4 is a transverse sectional view showing the outline of the configuration of the wafer processing apparatus.
Figure 5:
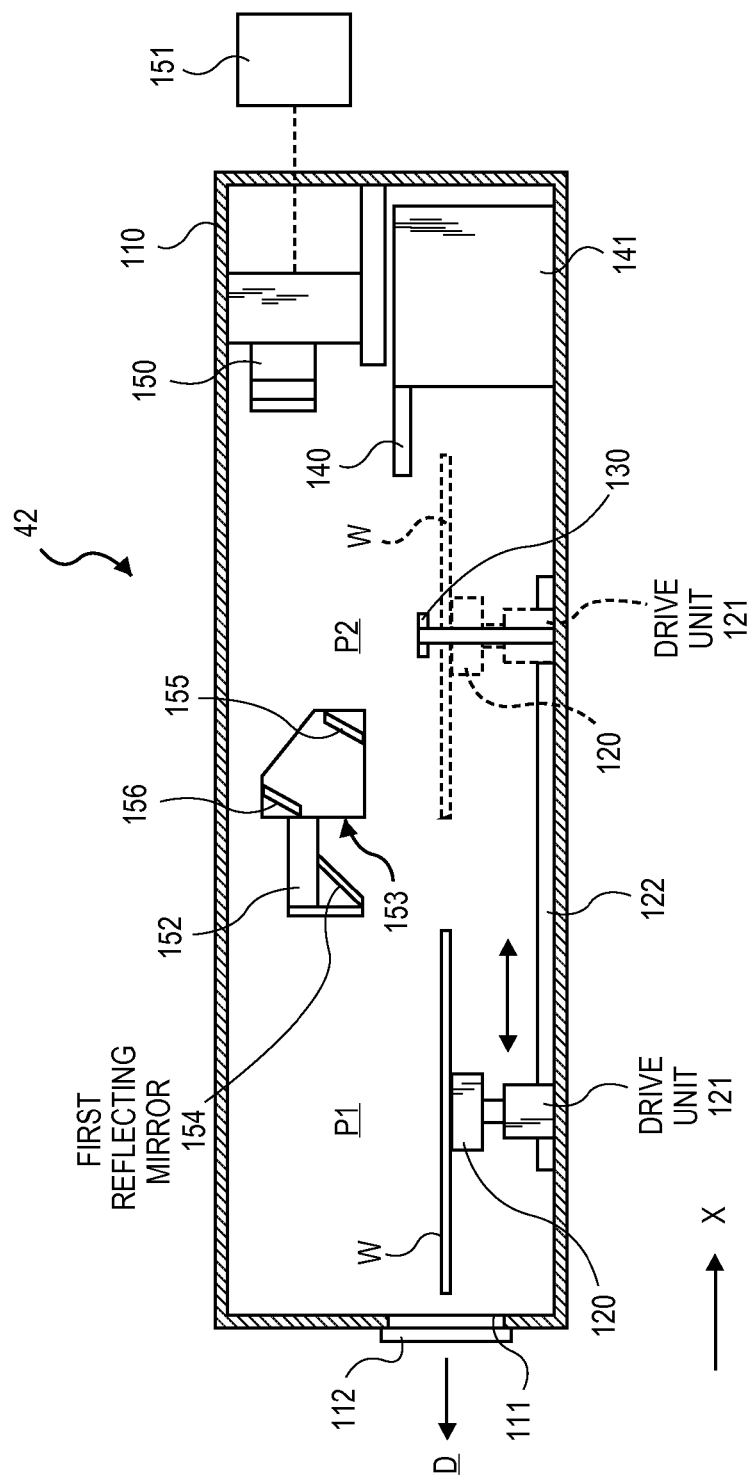
FIG. 5 is a longitudinal sectional view showing the outline of the wafer processing apparatus.

Next, the configuration of the above-described wafer processing apparatus 42 will be described. The wafer processing apparatus 42 has a processing container 110 as shown in FIG. 4 and FIG. 5. In a side surface of the processing container 110 on the wafer transfer region D side (on the X-direction negative direction side in FIG. 4 and FIG. 5), a transfer-in/out port 111 for transferring in/out the wafer W is formed. At the transfer-in/out port 111, an open/close shutter 112 is provided.

Inside the processing container 110, a holding unit 120 for suction-holding the wafer W thereon is provided. The holding unit 120 has a horizontal upper surface, and the upper surface is provided with, for example, a suction port (not shown) for sucking the wafer W. Suction through the suction port allows the wafer W to be suction-held on the holding unit 120.

A drive unit 121 is attached to the holding unit 120 as shown in FIG. 5. The drive unit 121 has, for example, a motor (not shown) built-in. The drive unit 121 can rotate the holding unit 120 and thus has a function as a rotation driving unit in the present invention and has an alignment function of adjusting the position of the wafer W. At the bottom surface of the processing container 110, a guide rail 122 is provided which extends from one end side (the X-direction negative direction side in FIG. 5) to the other end side (the X-direction positive direction side in FIG. 5) in the processing container 110. The drive unit 121 is provided on the guide rail 122. Further, the holding unit 120 and the drive unit 121 can move along the guide rail 122 between a delivery position P1 where the wafer W is delivered from/to the outside of the wafer processing apparatus 42 and an edge exposure position P2 where edge exposure processing is performed on the edge portion of the wafer W. Note that the drive unit 121 and the guide rail 122 constitute a moving mechanism in the present invention. Further, though the guide rail 122 is provided on the bottom surface of the processing container 110 in this embodiment, the guide rail may be buried in the bottom surface of the processing container 110.

Figure 6:
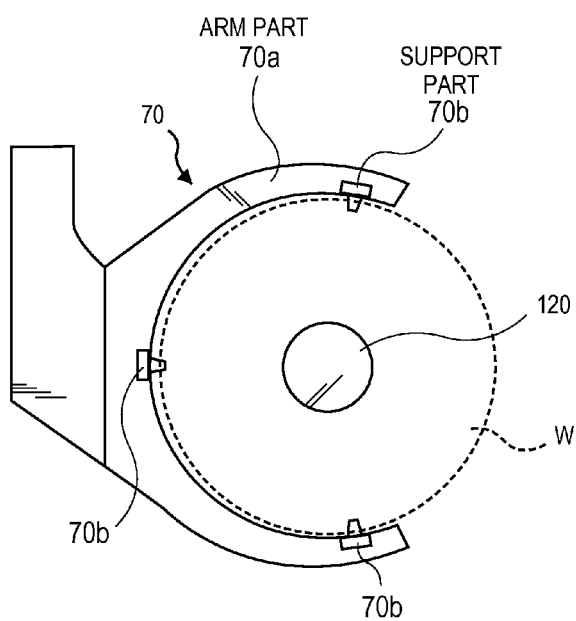
FIG. 6 is an explanatory view showing the relation between a transfer arm and a holding unit.

Further, when the wafer W is delivered from/to the outside of the wafer processing apparatus 42 at the delivery position P1, the holding unit 120 never interferes with the wafer transfer apparatus 70 provided outside the wafer processing apparatus 42 as shown in FIG. 6. Here, the wafer transfer apparatus 70 has an arm part 70a, for example, in an almost C-shape with a diameter slightly larger than that of the wafer W. Inside the arm part 70a, support parts 70b projecting inward and supporting the outer peripheral portion of the wafer W are provided at a plurality of places, for example, three places. The holding unit 120 has a diameter smaller than that of the wafer W and suction-holds the central portion of the wafer W. Therefore, the holding unit 120 never interferes with the wafer transfer apparatus 70.

As shown in FIG. 4 and FIG. 5, a position detection sensor 130 detecting the position of the edge portion of the wafer W held on the holding unit 120 is provided inside the processing container 110 and at the edge exposure position P2. The position detection sensor 130 has, for example, a CCD camera (not shown) to detect an eccentricity amount from the center of the wafer W held on the holding unit 120 and the position of a notch portion of the wafer W. Based on the eccentricity amount of the wafer W, an application position of light by an exposure unit 140 is set. Further, while the position detection sensor 130 is detecting the position of the notch portion, the drive unit 121 can rotate the holding unit 120 to adjust the position of the notch portion of the wafer W.

Inside the processing container 110, the exposure unit 140 is provided which applies light to the edge portion of the resist film above the wafer W held on the holding unit 120 to thereby expose the edge portion. In the exposure unit 140, a lamp house 141 is provided as a light source apparatus supplying light to the exposure unit 140. Inside the lamp house 141, an ultra-high pressure mercury lamp (not shown) and a collection mirror (not shown) collecting the light from the ultra-high pressure mercury lamp are provided. The exposure unit 140 and the lamp house 141 are arranged on the X-direction positive direction side of the edge exposure position P2, namely, at an X-direction positive direction end portion of the processing container 110.

Inside the processing container 110, an image capturing unit 150 is provided which captures an image of the wafer W held on the holding unit 120. The image capturing unit 150 is disposed on the X-direction positive direction side of the edge exposure position P2, namely, at the X-direction positive direction end portion of the processing container 110 and above the exposure unit 140 and the lamp house 141. For the image capturing unit 150, for example, a CCD camera is used. Further, the image capturing unit 150 is provided with an inspection unit 151 to which the image captured by the image capturing unit 150 is outputted and which inspects for defects of the wafer W based on image.

Inside the processing container 110 and between the delivery position P1 and the edge exposure position P2, an illumination unit 152 applying illumination and a direction change unit 153 changing the direction of an optical path formed between the wafer W held on the holding unit 120 and the image capturing unit 150 are provided. The illumination unit 152 and the direction change unit 153 are provided at positions opposite the image capturing unit 150 respectively and provided above the wafer W held on the holding unit 120. Further, the illumination unit 152 and the direction change unit 153 are fixed to the processing container 110, for example, by supporting members (not shown).

Figure 7:
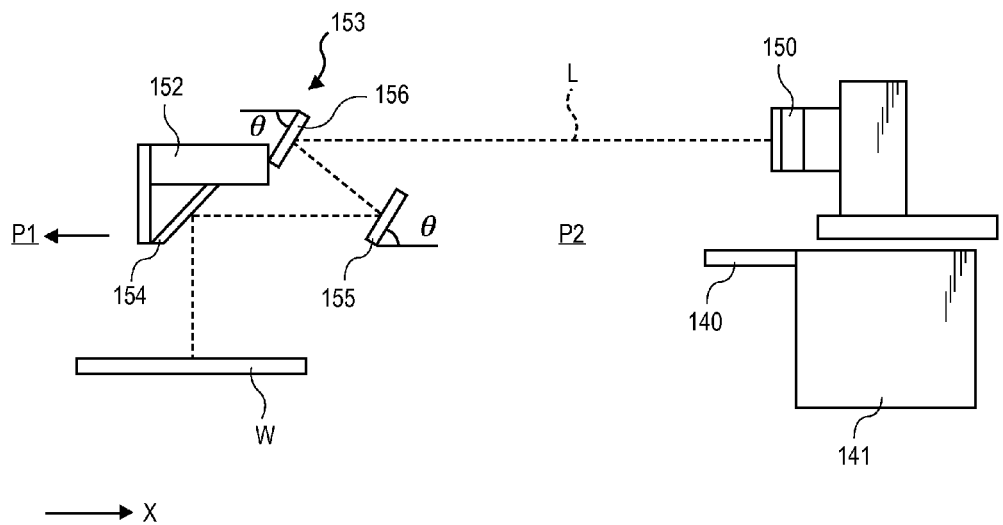
FIG. 7 is an explanatory view showing an optical path between a wafer and an image capturing unit.

The direction change unit 153 has a first reflecting mirror 154, a second reflecting mirror 155, and a third reflecting mirror 156 as shown in FIG. 7. The first reflecting mirror 154 is provided below the illumination unit 152. For the first reflecting mirror 154, for example, a half mirror is used and provided in a manner to incline at 45 degrees from the horizontal direction. Further, the illumination from the illumination unit 152 passes through the first reflecting mirror and is applied downward in the vertical direction and reflected on the wafer W. Further, the light reflected upward in the vertical direction from the wafer W is reflected off the first reflecting mirror 154 and travels in the horizontal direction to the edge exposure position P2 side (the X-direction positive direction side in FIG. 7).

The second reflecting mirror 155 is disposed at a position opposite the first reflecting mirror 154 and closer to the edge exposure position P2 side (the X-direction positive direction side) than is the first reflecting mirror 154. Further, the second reflecting mirror 155 is provided in a manner to incline at a predetermined inclination angle θ from the horizontal direction. The predetermined inclination angle θ is an angle larger than, for example, 45 degrees. The light from the first reflecting mirror 154 is then reflected off the second reflecting mirror 155 and travels obliquely upward at a predetermined reflection angle to the delivery position P1 side (the X-direction negative direction side in FIG. 7). In this event, the inclination angle θ of the second reflecting mirror 155 is larger than 45 degrees, so that the reflection angle of light at the second reflecting mirror 155 becomes smaller than 45 degrees.

The third reflecting mirror 156 is disposed between the first reflecting mirror 154 and the second reflecting mirror 155 and above the first reflecting mirror 154 and the second reflecting mirror 155. Further, the third reflecting mirror 156 is provided in a manner to incline at a predetermined inclination angle θ from the horizontal direction. The predetermined inclination angle θ is the same as the predetermined inclination angle θ of the second reflecting mirror 155. The light from the second reflecting mirror 155 is then reflected off the third reflecting mirror 156 and travels in the horizontal direction to the edge exposure position P2 side (the X-direction positive direction side in FIG. 7).

Since the direction change unit 153 has the first reflecting mirror 154, the second reflecting mirror 155 and the third reflecting mirror 156 as described above, the work distance of an optical path L between the wafer W and the image capturing unit 150 can be made longer without changing the position of the image capturing unit 150 in plan view as compared to the case of one reflecting mirror. The light reflected off the wafer W then travels along the optical path L and is captured into the image capturing unit 150, and the image of the wafer W is captured in the image capturing unit 150.

Since the third reflecting mirror 156 is provided above the first reflecting mirror 154 and the second reflecting mirror 155, the optical path L extends upward in the vertical direction and the image capturing unit 150 is also disposed at an upper position as compared to the case of one reflecting mirror. Here, since the image capturing unit 150 and the exposure unit 140 need to be arranged on the center axis of the wafer W, both of them cannot be arranged in the conventional apparatus configuration because the image capturing unit and the exposure unit interfere with each other. It is also conceivable that either the exposure unit or the image capturing unit is moved every edge exposure processing or inspection, but a moving mechanism for the exposure unit or the image capturing unit is required in this case, resulting in a large-scale apparatus. In this regard, the image capturing unit 150 is disposed at the upper position in this embodiment, thus making it possible to dispose the exposure unit 140 in a space formed below the image capturing unit 150.

In the above coating and developing treatment system 1, a control unit 200 is provided as illustrated in FIG. 1. The control unit 200 is, for example, a computer and has a program storage unit (not shown). In the program storage unit, a program is stored which executes the edge exposure processing of the wafer W and the inspection of the wafer W in the wafer processing apparatus 42. In addition, a program for executing the wafer processing in the coating and developing treatment system 1 is also stored in the program storage unit. Note that the programs may be the ones that are recorded, for example, in a computer-readable storage medium H such as a computer-readable hard disk (HD), flexible disk (FD), compact disk (CD), magneto-optical disk (MO), or memory card, and installed from the storage medium H into the control unit 200.

Next, the processing method of the wafer W performed using the coating and developing treatment system 1 configured as described above will be described.

First, a cassette C housing a plurality of wafers W is mounted on a predetermined cassette mounting plate 11 in the cassette station 2. Then, the wafers W in the cassette C are sequentially taken out by the wafer transfer apparatus 21 and transferred to, for example, the delivery apparatus 53 in the third processing block G3 of the processing station 3.

Subsequently, the wafer W is transferred by the wafer transfer apparatus 70 to the thermal processing apparatus 40 in the second block G2 and temperature-regulated. The wafer W is then transferred by the wafer transfer apparatus 70 to the lower anti-reflection film forming apparatus 31 in the first block G1 and a lower anti-reflection film is formed on the wafer W. The wafer W is then transferred to the thermal processing apparatus 40 in the second block G2 and heated and temperature-regulated, and then returned to the delivery apparatus 53 in the third block G3.

The wafer W is then transferred by the wafer transfer apparatus 90 to the delivery apparatus 54 in the same third block G3. Thereafter, the wafer W is transferred by the wafer transfer apparatus 70 to the adhesion apparatus 41 in the second block G2 and subjected to adhesion treatment. Thereafter, the wafer W is transferred by the wafer transfer apparatus 70 to the thermal processing apparatus 40 and temperature-regulated.

The wafer W is then transferred by the wafer transfer apparatus 70 to the resist coating apparatus 32 and a resist solution is applied onto the rotated wafer W, whereby a resist film is formed above the wafer W.

Thereafter, the wafer W is transferred by the wafer transfer apparatus 70 to the thermal processing apparatus 40 and subjected to pre-baking processing. Thereafter, the wafer W is transferred by the wafer transfer apparatus 70 to the delivery apparatus 55 in the third block G3.

Then, the wafer W is transferred by the wafer transfer apparatus 70 to the upper anti-reflection film forming apparatus 33, and an upper anti-reflection film is formed above the wafer W. Thereafter, the wafer W is transferred by the wafer transfer apparatus 70 to the thermal processing apparatus 40 and heated and temperature-regulated. Thereafter, the wafer W is transferred by the wafer transfer apparatus 70 to the wafer processing apparatus 42. In the wafer processing apparatus 42, edge exposure processing is performed on the edge portion of the resist film above the wafer W, and inspection for defects of the wafer W for which the edge exposure processing has been completed is performed. Note that the details of the edge exposure processing and the inspection of the wafer W in the wafer processing apparatus 42 will be described later.

The wafer W is then transferred by the wafer transfer apparatus 70 to the delivery apparatus 56 in the third block G3. The wafer W which has been judged to have defects in the wafer processing apparatus 42 is then transferred by the wafer transfer apparatus 21 to the cassette C on the predetermined cassette mounting plate 11.

On the other hand, the wafer W which has been judged to be normal without defects in the wafer processing apparatus 42 is transferred by the wafer transfer apparatus 90 to the delivery apparatus 52 and transferred by the shuttle transfer apparatus 80 to the delivery apparatus 62 in the fourth block G4.

Thereafter, the wafer W is transferred by the wafer transfer apparatus 100 in the interface station 5 to the aligner 4 and subjected to exposure processing.

Then, the wafer W is transferred by the wafer transfer apparatus 100 from the aligner 4 to the delivery apparatus 60 in the fourth block G4. Thereafter, the wafer W is transferred by the wafer transfer apparatus 70 to the thermal processing apparatus 40 and subjected to post-exposure baking processing. Thereafter, the wafer W is transferred by the wafer transfer apparatus 70 to the developing apparatus 30 and developed. After completion of the development, the wafer W is transferred by the wafer transfer apparatus 70 to the thermal processing apparatus 40 and subjected to post-baking processing.

Thereafter, the wafer W is transferred by the wafer transfer apparatus 70 to the delivery apparatus 50 in the third block G3 and then transferred by the wafer transfer apparatus 21 in the cassette station 2 into the cassette C on the predetermined cassette mounting plate 11. Thus, a series of photolithography process is completed.

Next, the edge exposure processing of the wafer W and the inspection of the wafer W in the above-described wafer processing apparatus 42 will be described.

Figure 8:
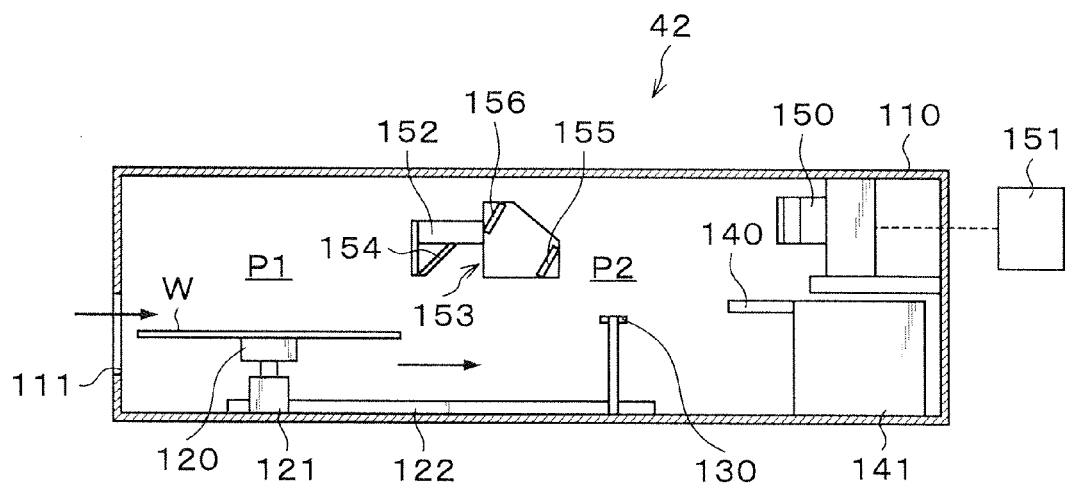
FIG. 8 is a an explanatory view showing the appearance that a wafer is transferred into the wafer processing apparatus.

The wafer W transferred by the wafer transfer apparatus 70 to the wafer processing apparatus 42 via the transfer-in/out port 111 is first delivered to the holding unit 120 at the delivery position P1 as shown in FIG. 8 and held on the holding unit 120. Then, the holding unit 120 is moved by the drive unit 121 from the delivery position P1 to the edge exposure position P2 side at a predetermined speed.

Figure 9:
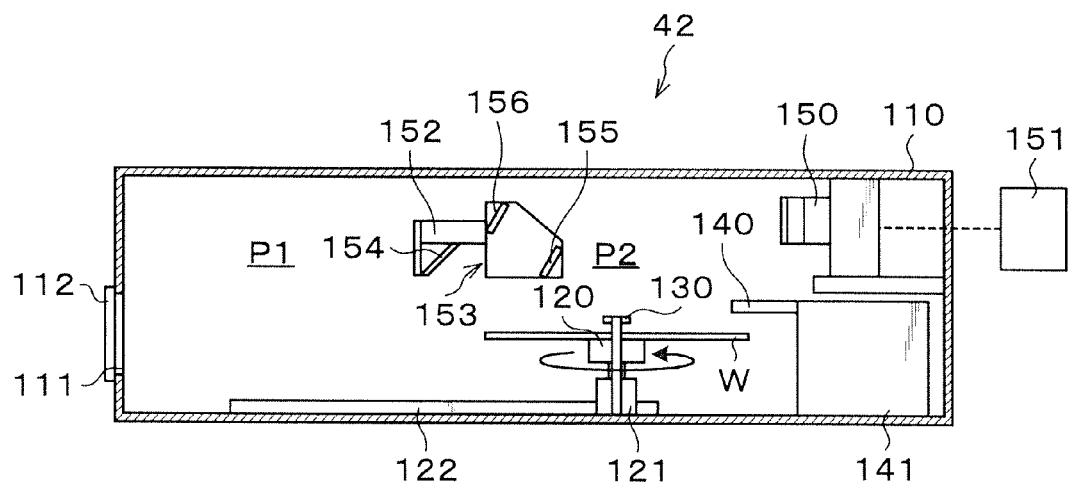
FIG. 9 is an explanatory view showing the appearance that edge exposure processing is performed on an edge portion of the wafer.

After the wafer W held on the holding unit 120 is moved to the edge exposure position P2, the holding unit 120 is rotated by the drive unit 121 while the position detection sensor 130 is detecting the position of the notch portion of the wafer W as shown in FIG. 9. The position of the notch portion of the wafer W is then adjusted, whereby the wafer W is disposed at a predetermined position. The eccentricity amount from the center of the wafer W held on the holding unit 120 is detected by the position detection sensor 130, and the application position of light by the exposure unit 140 is set based on the eccentricity amount of the wafer W. Thereafter, light is applied from the exposure unit 140 to a predetermined position of the edge portion of the wafer W while the wafer W is being rotated by the drive unit 121. Thus, the edge portion of the resist film above the wafer W is subjected to exposure processing.

Figure 10:
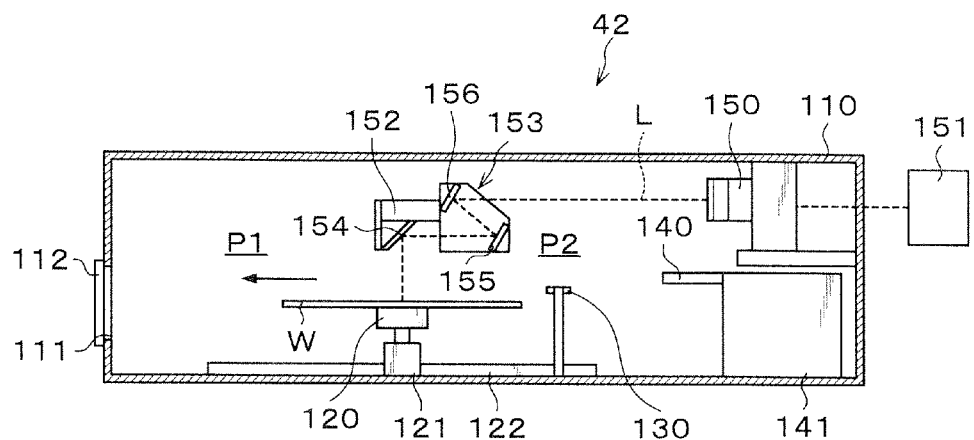
FIG. 10 is an explanatory view showing the appearance that inspection of the wafer is performed.

Thereafter, as shown in FIG. 10, the holding unit 120 is moved by the drive unit 121 from the edge exposure position P2 to the delivery position P1 side at a predetermined speed. Then, illumination is applied from the illumination unit 152 to the wafer W when the wafer W passes under the first reflecting mirror 154. The light by the illumination reflected off the top of the wafer W is reflected off the first reflecting mirror 154, the second reflecting mirror 155, and the third reflecting mirror 156 and travels along the optical path L and is captured in the image capturing unit 150. Then, an image of the wafer W is captured by the image capturing unit 150. The captured image of the wafer W is outputted to the inspection unit 151, and the inspection unit 151 inspects the wafer W for defects based on the outputted image.

Figure 11:
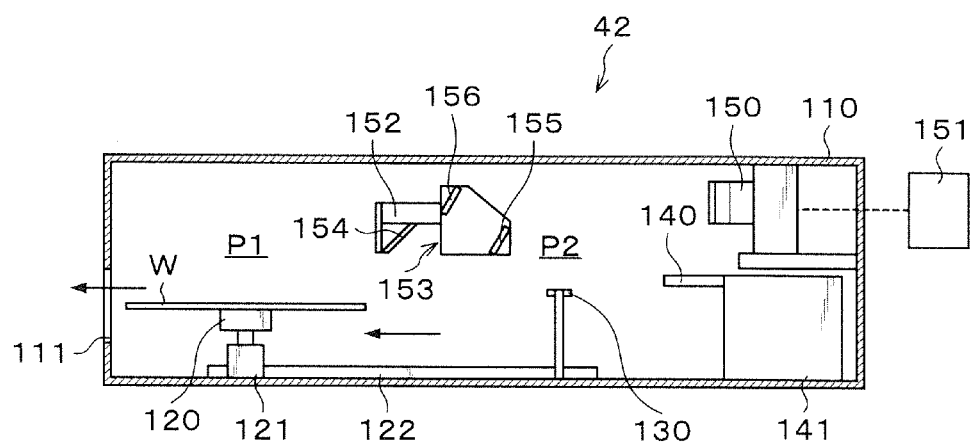
FIG. 11 is an explanatory view showing the appearance that the wafer is transferred out of the wafer processing apparatus.

Then, after the wafer W held on the holding unit 120 is moved to the edge exposure position P2 as shown in FIG. 11, the wafer W is delivered from the holding unit 120 to the wafer transfer apparatus 70. The wafer W is then transferred out of the wafer processing apparatus 42 via the transfer-in/out port 111.

According to the above embodiment, since the direction change unit 153 has the first reflecting mirror 154, the second reflecting mirror 155, and the third reflecting mirror 156, the work distance of the optical path L between the wafer W held on the holding unit 120 and the image capturing unit 150 can be made longer without changing the position of the image capturing unit 150 in plan view. In addition, in this case, there is no need to change the lens of the CCD camera of the image capturing unit 150. Accordingly, it is possible to obtain a precise image with less distortion of image in the image capturing unit 150 and appropriately conduct the inspection of the wafer W.

Further, since the reflection angle of the light reflected off the second reflecting mirror 155 and the third reflecting mirror 156 is an angle smaller than 45 degrees, the work distance of the optical path L can be secured while extension of the optical path L upward in the vertical direction is suppressed. Accordingly, is it possible to suppress an increase in size of the wafer processing apparatus 42.

Further, the optical path L between the wafer W and the image capturing unit 150 extends upward in the vertical direction and the image capturing unit 150 is also disposed at the upper position, thus making it possible to dispose the exposure unit 140 in the space formed below the image capturing unit 150. Since the exposure unit 140 and the image capturing unit 150 are provided in the wafer processing apparatus 42, both of the edge exposure processing of the wafer W and the inspection of the wafer W can be performed while the wafer W is being transferred in the wafer processing apparatus 42. Accordingly, when performing the edge exposure processing of the wafer W and the inspection of the wafer W, it becomes unnecessary to transfer the wafer W between the edge exposure apparatus and the inspection apparatus using the wafer transfer apparatus 70 as in the prior art, so that another wafer W can be transferred between other processing apparatuses using the wafer transfer apparatus 70. Therefore, it is possible to reduce other wafers W waiting for transfer and improve the throughput of the wafer processing. Furthermore, it is unnecessary to individually provide the edge exposure apparatus and the inspection apparatus as in the prior art, contributing to a reduction in footprint.

Further, since the position detection sensor 130 detecting the position of the edge portion of the wafer W is provided in the wafer processing apparatus 42, it is possible to adjust the position of the notch portion of the wafer W by rotating the holding unit 120 by the drive unit 121 while detecting the position of the notch portion by the position detection sensor 130. In the case where the edge exposure apparatus and the inspection apparatus are separately provided and the wafer W is transferred between the edge exposure apparatus and the inspection apparatus using the wafer transfer apparatus 70 here as in the prior art, even if the position of the notch portion of the wafer W is adjusted in the edge exposure apparatus, it is necessary to readjust the position of the notch portion of the wafer W in the inspection apparatus because the wafer transfer apparatus 70 is movable also in the horizontal direction and the position of the notch portion of the wafer W is therefore displaced during the transfer. In this regard, according to this embodiment, the number of times of the position adjustment of the notch portion can be only one when performing the edge exposure processing of the wafer W and the inspection of the wafer W. Therefore, the throughput of the wafer processing can be improved. Note the study of the inventors shows that by reducing the number of times the position adjustment of the notch portion of the wafer W to one, the throughput of the wafer processing can be shortened by about two seconds.

Figure 12:
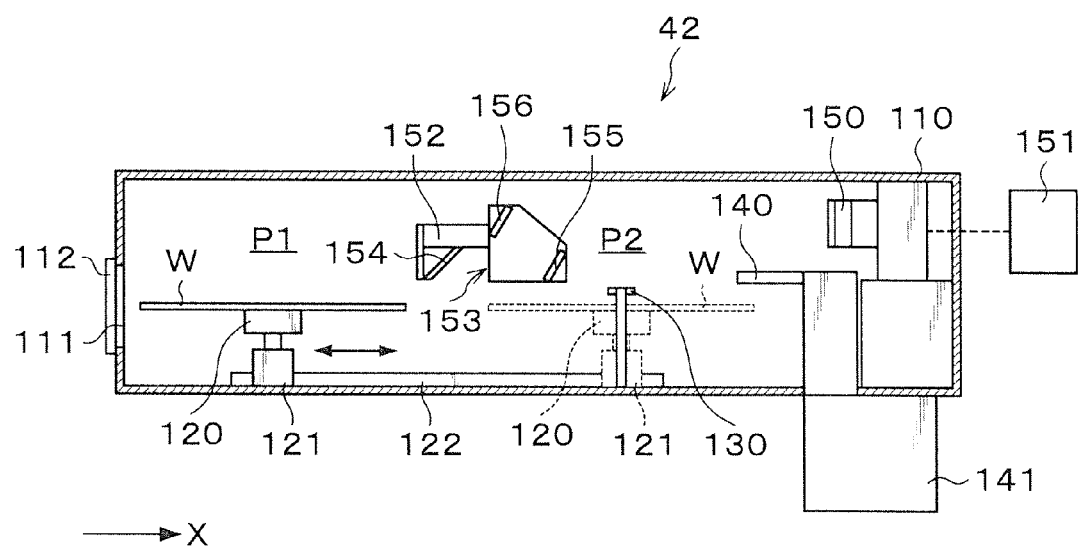
FIG. 12 is a longitudinal sectional view showing the outline of the configuration of a wafer processing apparatus according to another embodiment.

Though the lamp house 141 is provided inside the processing container 110 in the wafer processing apparatus 42 of the above embodiment, the lamp house 141 may be provided outside the processing container 110 as shown in FIG. 12.

Note that the other configuration of the wafer processing apparatus 42 is the same as that of the above-described wafer processing apparatus 42 and description thereof is omitted.

The inside of the processing container 110 is maintained at a positive pressure here because the above-described edge exposure processing of the wafer W and the inspection of the wafer W are performed therein. When maintenance of the lamp house 141 is performed under such circumstances, it is unnecessary to open the atmosphere in the processing container 110 to the atmospheric air because the lamp house 141 is provided outside the processing container 110. Accordingly, the maintenance of the lamp house 141 can be easily performed. Further, the inside of the processing container 110 is never affected by heat generation from the lamp house 141.

Though the wafer processing apparatus 42 is disposed in the second block G2 of the processing station 3 in the above embodiment, the position of the wafer processing apparatus 42 can be arbitrarily selected. The wafer processing apparatus 42 may be disposed, for example, in the interface station 5 or disposed in the third block G3 or the fourth block G4 of the processing station 3.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention can employ not only these examples but also various forms. The present invention is also applicable to the case where the substrate is another substrate such as an FPD (Flat Panel Display), a mask reticle for a photomask, or the like other than the wafer.

What is claimed is:

1. A substrate processing apparatus, comprising:
a holding unit holding a substrate;
a rotation driving unit rotating the substrate held on said holding unit;
a moving mechanism moving said holding unit between a delivery position where the substrate is delivered from/to an outside and an edge exposure position where edge exposure processing is performed on an edge portion of a coating film formed above the substrate;
an exposure unit provided on the edge exposure position side and exposing the edge portion of the coating film above the substrate held on said holding unit;
an image capturing unit provided on the edge exposure position side and above said exposure unit and capturing an image of the substrate held on said holding unit; and
a direction change unit provided between the delivery position and the edge exposure position and changing a direction of an optical path formed between the substrate held on said holding unit and said image capturing unit,
wherein said direction change unit comprises:
a first reflecting mirror reflecting light reflected upward in a vertical direction from the substrate, in a horizontal direction to the edge exposure position side;
a second reflecting mirror reflecting light from said first reflecting mirror, obliquely upward at a predetermined reflection angle to the delivery position side; and
a third reflecting mirror reflecting light from said second reflecting mirror, in a horizontal direction to the edge exposure position side to transmit the light to said image capturing unit.

2. The substrate processing apparatus as set forth in claim 1, further comprising:
a position detection sensor detecting a position of the edge portion of the substrate held on said holding unit; and
a control unit controlling said rotation driving unit to adjust the position of the edge portion of the substrate based on a detection result of said position detection sensor.

3. The substrate processing apparatus as set forth in claim 1,
wherein the predetermined reflection angle is an angle smaller than 45 degrees.

4. The substrate processing apparatus as set forth in claim 1,
wherein said exposure unit is disposed inside a processing container, and
wherein a light source apparatus provided in said exposure unit is disposed outside said processing container.

5. A substrate processing method using a substrate processing apparatus,
the substrate processing apparatus comprising: a holding unit holding a substrate; a rotation driving unit rotating the substrate held on the holding unit; a moving mechanism moving the holding unit between a delivery position where the substrate is delivered from/to an outside and an edge exposure position where edge exposure processing is performed on an edge portion of a coating film formed above the substrate; an exposure unit provided on the edge exposure position side and exposing the edge portion of the coating film above the substrate held on the holding unit; an image capturing unit provided on the edge exposure position side and above the exposure unit and capturing an image of the substrate held on the holding unit; and a direction change unit comprising a first reflecting mirror reflecting light reflected upward in a vertical direction from the substrate, in a horizontal direction to the edge exposure position side; a second reflecting mirror reflecting light from the first reflecting mirror, obliquely upward at a predetermined reflection angle to the delivery position side; and a third reflecting mirror reflecting light from the second reflecting mirror, in a horizontal direction to the edge exposure position side to transmit the light to the image capturing unit, and changing a direction of an optical path formed between the substrate held on the holding unit and the image capturing unit, and provided between the delivery position and the edge exposure position,
said substrate processing method comprising:
an edge exposure step of moving the substrate held on the holding unit to the edge exposure position by the moving mechanism and applying light from the exposure unit to the edge portion of the coating film above the substrate while rotating the substrate by the rotation driving unit to expose the edge portion at the edge exposure position; and
an inspection step of then capturing an image of the substrate by the image capturing unit during a time when the substrate held on the holding unit is moved by the moving mechanism from the edge exposure position to the delivery position and when the substrate passes under the direction change unit, and inspecting the substrate for a defect based on the captured image of the substrate.

6. The substrate processing method as set forth in claim 5,
wherein the substrate processing apparatus further comprises a position detection sensor detecting a position of the edge portion of the substrate held on the holding unit, and
wherein in said edge exposure step, the substrate is rotated by the rotation driving unit based on a detection result of the position detection sensor to adjust the position of the edge portion of the substrate.

7. The substrate processing method as set forth in claim 5, wherein the predetermined reflection angle is an angle smaller than 45 degrees.

8. A non-transitory computer-readable storage medium storing a program running on a computer of a control unit controlling a substrate processing apparatus to cause the substrate processing apparatus to execute a substrate processing method, the substrate processing apparatus comprising: a holding unit holding a substrate; a rotation driving unit rotating the substrate held on the holding unit; a moving mechanism moving the holding unit between a delivery position where the substrate is delivered from/to an outside and an edge exposure position where edge exposure processing is performed on an edge portion of a coating film formed above the substrate; an exposure unit provided on the edge exposure position side and exposing the edge portion of the coating film above the substrate held on the holding unit; an image capturing unit provided on the edge exposure position side and above the exposure unit and capturing an image of the substrate held on the holding unit; and a direction change unit comprising a first reflecting mirror reflecting light reflected upward in a vertical direction from the substrate, in a horizontal direction to the edge exposure position side; a second reflecting mirror reflecting light from the first reflecting mirror, obliquely upward at a predetermined reflection angle to the delivery position side; and a third reflecting mirror reflecting light from the second reflecting mirror, in a horizontal direction to the edge exposure position side to transmit the light to the image capturing unit, and changing a direction of an optical path formed between the substrate held on the holding unit and the image capturing unit, and provided between the delivery position and the edge exposure position, and the substrate processing method comprising:

an edge exposure step of moving the substrate held on the holding unit to the edge exposure position by the moving mechanism and applying light from the exposure unit to the edge portion of the coating film above the substrate while rotating the substrate by the rotation driving unit to expose the edge portion at the edge exposure position; and an inspection step of then capturing an image of the substrate by the image capturing unit during a time when the substrate held on the holding unit is moved by the moving mechanism from the edge exposure position to the delivery position and when the substrate passes under the direction change unit, and inspecting the substrate for a defect based on the captured image of the substrate.

* * * * *